(12) United States Patent
Iotov

(10) Patent No.: US 7,487,485 B2
(45) Date of Patent: *Feb. 3, 2009

(54) METHODS AND APPARATUS FOR DESIGN ENTRY AND SYNTHESIS OF DIGITAL CIRCUITS

(75) Inventor: Mihail Iotov, San Jose, CA (US)

(73) Assignee: Altera Corporation, San Jose, CA (US)

( * ) Notice: Subject to any disclaimer, the term of this patent is extended or adjusted under 35 U.S.C. 154(b) by 266 days.

This patent is subject to a terminal disclaimer.

(21) Appl. No.: 11/473,848

(22) Filed: Jun. 23, 2006

(65) Prior Publication Data

US 2006/0242616 A1    Oct. 26, 2006

Related U.S. Application Data

(63) Continuation of application No. 10/687,192, filed on Oct. 15, 2003, now Pat. No. 7,080,345.

(51) Int. Cl.
G06F 17/50 (2006.01)
G06F 9/45 (2006.01)

(52) U.S. Cl. ............................................ 716/6; 716/18
(58) Field of Classification Search ........................ None
See application file for complete search history.

(56) References Cited

U.S. PATENT DOCUMENTS

| 6,120,549 | A | 9/2000 | Goslin et al. |
|---|---|---|---|
| 6,385,757 | B1 | 5/2002 | Gupta et al. |
| 6,401,230 | B1 | 6/2002 | Ahanessians et al. |
| 6,993,464 | B2 * | 1/2006 | Chiu et al. ............ 703/2 |
| 2004/0107078 | A1 | 6/2004 | Chiu et al. |

OTHER PUBLICATIONS

U.S. Patent Application of Mihail Iotov and Gregory Starr, U.S. Appl. No. 10/353,816, filed Jan. 28, 2003, for "*System And Method For Design Entry And Synthesis In Programmable Logic Devices*".

* cited by examiner

*Primary Examiner*—Leigh Marie Garbowski
(74) *Attorney, Agent, or Firm*—Weaver Austin Villeneuve & Sampson LLP

(57) ABSTRACT

Methods and apparatus are provided for design entry and synthesis of components, such as components implemented on a programmable chip. In one example, a design tool receives natural or intuitive parameters describing characteristics of a component in a design. Natural or intuitive parameters include input data rate, output latency, footprint, etc. Non-natural or non-intuitive parameters such as clock rate and pipeline stages need not be provided. The design tool automatically selects optimal components using natural parameters. Multiple instantiations of an optimal component, or multiplexing through an optimal component can be used to further improve the design.

38 Claims, 11 Drawing Sheets

Figure 4

| Pipeline | Period | Tco | Fmax | Lcell | Data Rate | Latency |
|---|---|---|---|---|---|---|
| 2 | 8.815 | 15.341 | 113 | 3286 | 565 | 33 |
| 3 | 6.146 | 14.465 | 163 | 3354 | 815 | 33 |
| 4 | 6.575 | 12.11 | 152 | 3346 | 760 | 38 |
| 5 | 6.395 | 12.426 | 156 | 3418 | 780 | 44 |
| 6 | 4.461 | 11.722 | 224 | 3448 | 1120 | 38 |
| : | : | : | : | : | : | : |

METHODS AND APPARATUS FOR DESIGN ENTRY AND SYNTHESIS OF DIGITAL CIRCUITS

This application is a continuation of U.S. patent application Ser. No. 10/687,192, filed on Oct. 15, 2003, now U.S. Pat. No. 7,080,345 which is hereby incorporated by reference for all purposes.

BACKGROUND OF THE INVENTION

1. Field of the Invention

The present invention relates to digital circuits. In one example, the present invention relates to methods and apparatus for design entry and synthesis of digital circuits for implementation on a programmable chip.

2. Description of the Prior Art

A number of benefits have spurred efforts towards higher levels of system integration on a programmable chip. Integrating processors and peripherals on a single integrated circuit allows compact system size, low power requirements, durability, high-performance, and low unit costs. Programmable logic allows custom logic in an integrated circuit.

Implementing a system on a programmable chip typically entails using an array of techniques and mechanisms for a user to specify and customize designs of components. In many instances, components include multipliers, adders, filters, decoders, etc. Frequently, the components can be designed from component modules that are user configurable by specifying one or more design parameters appropriate for the desired application. In some cases, the components may even define an entire design by itself. Hence, by configuring the component modules, various designs for processor cores and peripherals are specified and customized.

However, techniques and mechanisms for allowing efficient and practical design entry and synthesis of components (e.g., digital circuits) are limited. Conventional techniques for entering design parameters often begin with the designer specifying parameters (e.g., clock frequency, pipelining) that are not natural in terms of the thought process of a designer, especially when viewed in terms of the desired final component.

Consequently, it is therefore desirable to provide improved methods and apparatus for designing digital circuits in general. More specifically, it is desirable to provide improved techniques and mechanisms for design entry and synthesis of digital circuits for implementation on programmable chips.

SUMMARY OF THE INVENTION

Methods and apparatus are provided for design entry and synthesis of components, such as components implemented on a programmable chip. In one example, a design tool receives natural or intuitive parameters describing characteristics of a component in a design. Natural or intuitive parameters include input data rate, output latency, footprint, area, power, etc. Non-natural or non-intuitive parameters such as clock rate and pipeline stages need not be provided. The design tool automatically selects optimal components using natural parameters. Multiple instantiations of an optimal component, or multiplexing through an optimal component can be used to further improve the design.

One aspect of the present invention involves a method for implementing an electronic design. The method includes (1) receiving input information identifying a desired module and a desired input data rate associated with the desired module; (2) identifying a plurality of candidate modules, the plurality of candidate modules having simulation information indicating associated data rates; and (3) selecting an optimal candidate module from the pool of candidate modules for implementing the electronic design, the optimal candidate module selected using the desired input data rate. Generally, the plurality of candidate modules is associated with chip area usage requirements and power requirements that are used as factors in selecting the optimal candidate module.

In one embodiment, the method includes receiving a desired output latency associated with the desired module. The optimal candidate module can then be selected using the desired input data rate and the desired output latency. Generally, receiving the desired data rate and the desired output latency allows selection of the optimal candidate module without having to receive information on clock frequency.

In another embodiment, the method includes using time-domain multiplexing if the optimal candidate module runs at a data rate substantially faster than the desired input data rate. Typically, time-domain multiplexing includes generating a clock synthesis circuit with either a phase lock loop or a delay lock loop.

In yet another embodiment, the method includes using multiple instantiations of the optimal candidate module if the optimal candidate module runs at a data rate substantially slower than the desired input data rate.

Another aspect of the present invention involves an apparatus for implementing an electronic design. The apparatus includes a design tool configured to receive input information identifying a desired module and a desired input data rate associated with the desired module. The design tool is also configured to identify a plurality of candidate modules; the plurality of candidate modules having simulation information indicating associated data rates. Further, the design tool is configured to select an optimal candidate module from the pool of candidate modules for implementing the electronic design, the optimal candidate module selected using the desired input data rate.

In one embodiment, the design tool is configured to receive a desired output latency associated with the desired module where the optimal candidate module is selected using the desired input data rate and the desired output latency.

In another embodiment, the design tool is configured to use time-domain multiplexing if the optimal candidate module runs at a data rate substantially faster than the desired input data rate.

In yet another embodiment, the design tool is configured to use multiple instantiations of the optimal candidate module if the optimal candidate module runs at a data rate substantially slower than the desired input data rate.

Yet another aspect of the invention pertains to computer program products including a machine readable medium on which is stored program instructions, tables or lists, and/or data structures for implementing a method as described above. Any of the methods, tables, or data structures of this invention may be represented as program instructions that can be provided on such computer readable media. Still other aspects relate to systems including a processor and memory for implementing a method as described above. Any of the method or techniques of this invention may be implemented on a system having a processor and memory.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

FIG. 4 is a diagrammatic representation of a portion of a library having component information.

DETAILED DESCRIPTION OF SPECIFIC EMBODIMENTS

Reference will now be made in detail to some specific embodiments of the invention including the best modes contemplated by the inventor(s) for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Aspects of this invention provide a design tool having functionality for design entry and synthesis of digital circuits that can be implemented on programmable chips. The design tool is configured for receiving input information identifying a desired module and a desired input data rate associated with the desired module. It is also configured for identifying a plurality of candidate modules where the plurality of candidate modules has simulation information indicating associated data rates. Further, the design tool is configured for selecting an optimal candidate module from the pool of candidate modules based on the desired input data rate. Alternatively, a desired output latency may also be received and used as a basis of selecting the optimal candidate module. In addition, depending on how the optimal candidate module meets user/system requirements, the design tool may or may not generate either clock synthesis circuitry with multiplexing or clock synthesis circuitry with multiple instantiations of a base circuit.

Generally, an optimal candidate module (e.g., optimal component; revised optimal component) is defined as a candidate module (e.g., component) that meets the user requirements in terms of the natural parameters (e.g., data rate; output latency) in the specified area and/or power requirement (e.g., minimum area and/or minimum power). On the other hand, output latency is typically defined as how long it takes after data is valid at the input to get valid data at the output. Finally, data rate is generally defined as how fast data can be fed in and out.

Figure 1:
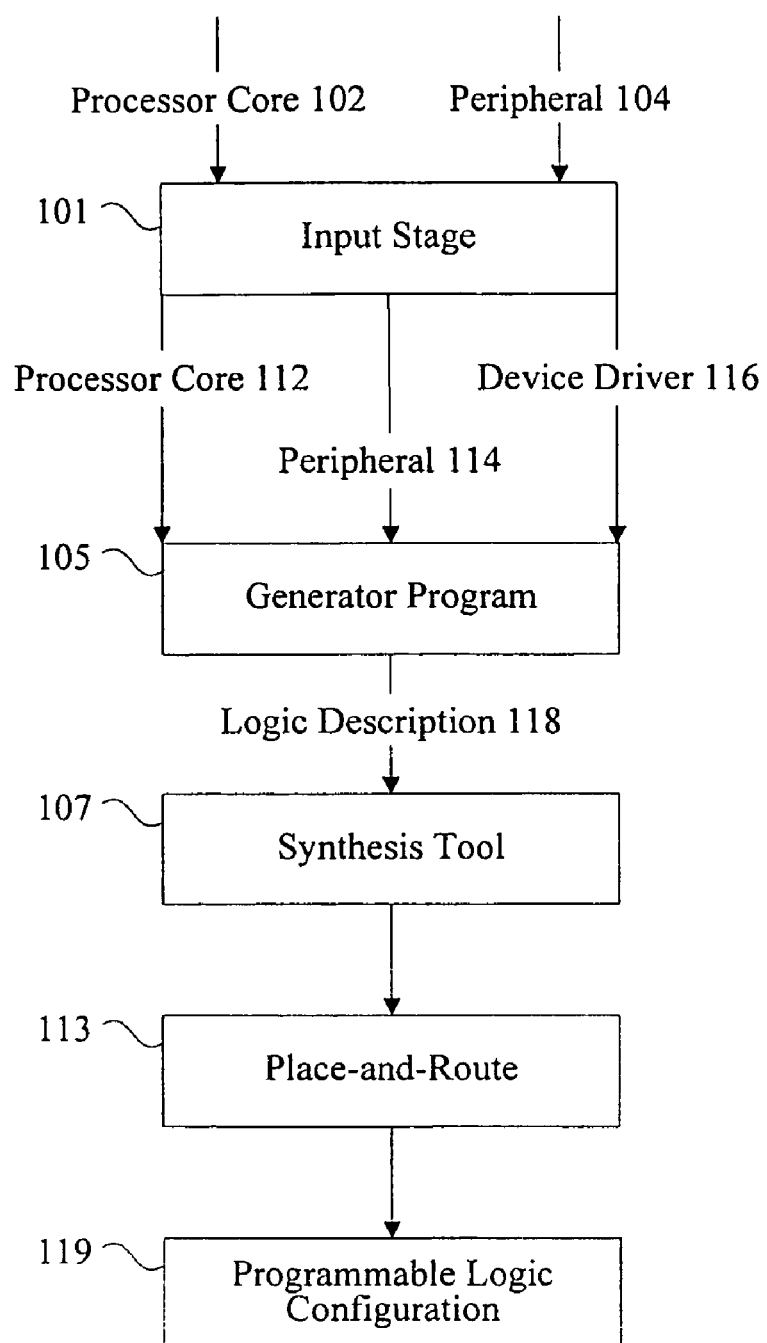
FIG. 1 is a diagrammatic representation showing one context that can use the techniques of the present invention.

FIG. 1 is a diagrammatic representation showing one context that can use the techniques of the present invention. Although the techniques of the present invention will be described in the context of tools for customizing components for implementation on a programmable chip, it should be noted that the techniques of the present invention can be applied to a variety of contexts.

An application environment such as an input stage 101 is provided to allow a user to select and parameterize components for a programmable chip. Some examples of components are multipliers, adders, filters, decoders, processor cores such as a RISC processor core, peripheral interfaces such as an interface to external memory, and peripheral components such as a timer or universal asynchronous receiver transmitter (UART). Processor core, peripherals, and other components can all be interconnected on the programmable chip. The components can also be connected with other on-chip or off-chip components.

An application environment provides a platform to run tools to allow selection and parameterization of components. In one example, the application environment is IP Toolbench (an IP Software development platform) available from Altera Corporation of San Jose, Calif. Any tool used to customize a component for implementation on a programmable chip is referred to herein as a wizard. According to various embodiments, each component has an associated wizard. A processor core component 102 includes a wizard for displaying windows for parameterizing the processor core for implementation on the programmable chip. A peripheral component 104 includes a wizard for receiving parameter information on a peripheral. Each component may use component specific modules for receiving and storing data. Configuring a programmable chip with a particular logic description or downloading a logic description onto a programmable chip is referred to herein as implementing a programmable chip. Some examples of programmable chips that can be implemented using the techniques of the present invention are programmable logic devices, complex programmable logic devices, programmable logic arrays, programmable array logic devices, and field-programmable gate arrays.

A generator program creates a logic description of the various modules using processor core information 112, peripheral information 114, and device driver information 116 associated with various components. With the processor core information 112 and the peripheral information 114 provided accurately, the generator program 105 can then output a logic description 118. The logic description 118 is then passed to a variety of synthesis tools 107, place and route programs 113, and programmable logic configuration tools 119 to allow a logic description to be downloaded onto the programmable chip.

According to various embodiments, the generator program 105 is a Perl script creating HDL files such as Verilog, Abel, VHDL, and AHDL files from the parameter information entered by a user. In some embodiments, the generator program 105 also provides information to a synthesis tool 107 to allow HDL files to be automatically synthesized. Some of the available synthesis tools are Leonardo Spectrum, available from Mentor Graphics Corporation of Wilsonville, Oreg. and Synplify available from Synplicity Corporation of Sunnyvale, Calif.

Also according to various embodiments, the place and route tool 113 and the programmable logic configuration stage 119 are provided in the Quartus Development Tool, available from Altera Corporation of San Jose, Calif. As will be appreciated by one of skill in the art, a variety of synthesis, place and route, and programmable logic configuration tools can be used to implement various techniques of the present invention.

Figure 2:
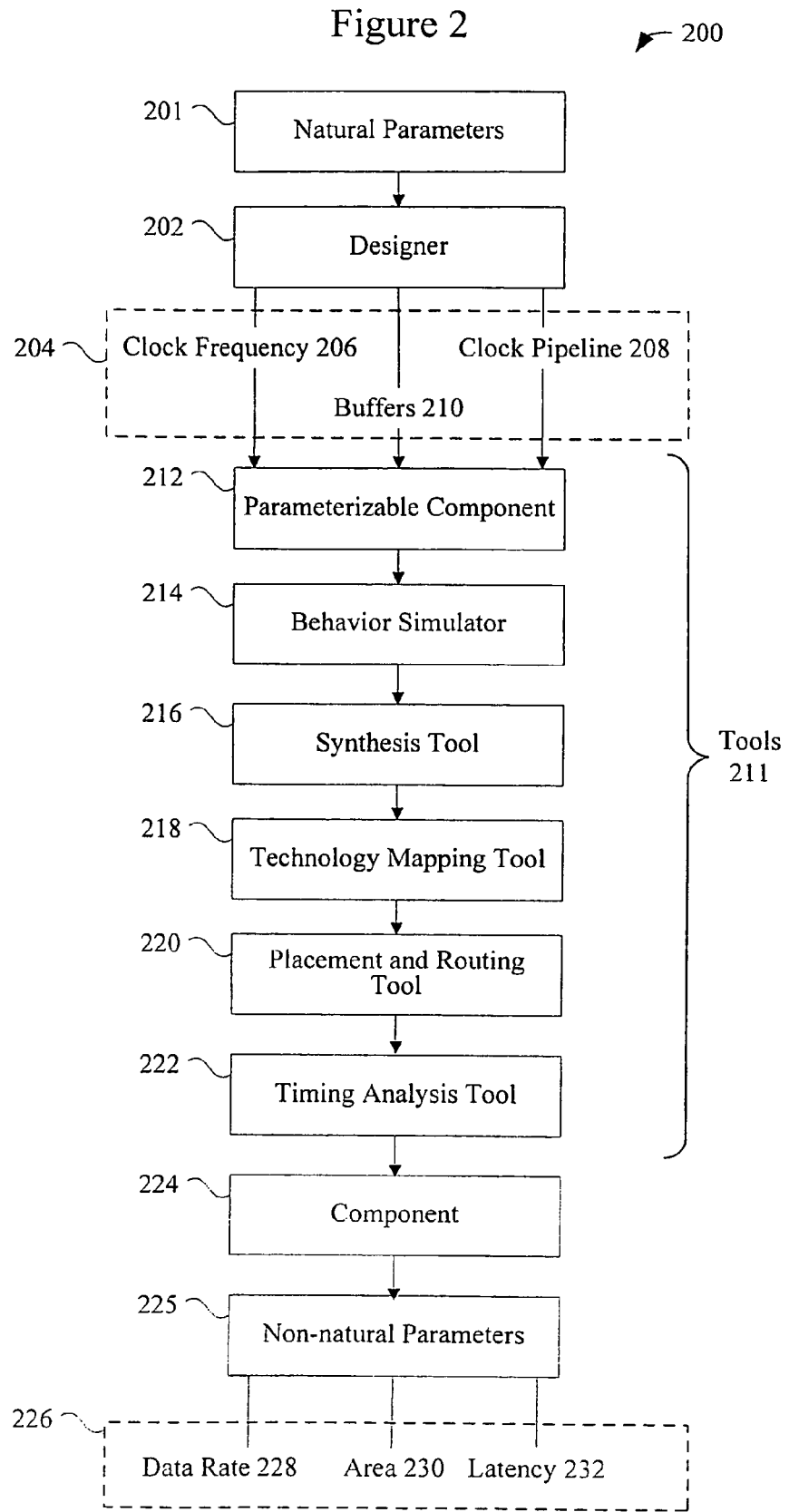
FIG. 2 is a diagrammatic representation showing a system for specifying time constraints on a component.

FIG. 2 is a diagrammatic representation showing a system 200 for specifying time constraints on a component. According to various embodiments, a set of parameters is provided for specifying the time constraints with various tools 211. For example, the set of parameters often includes non-natural parameters 204 such as clock frequency 206, clock pipeline 208, or buffers 210. That is, the specified parameters are not component defining parameters (e.g., area, data rate, latency) that the designer is most concerned with when considering the overall requirements (e.g., scope) that the component must satisfy. This is because the non-natural specified parameters require additional steps or processing (e.g., compilation, synthesis, translation) before the component defining parameters are known. Only then will the designer get a first sense of whether the non-natural specified parameters work in producing a component that satisfies the overall requirements. Needless to say, this trial and error design entry process and synthesis of components consume lots of time and resources, especially if the process is manually repeated many times over. As a result, non-optimal components may be generated and mistakenly used by the designer.

In addition, the non-natural parameters often are not portable between different tools. For example, design timing constraints (e.g., clock frequency, clock pipeline) included in non-natural parameters generally have to be translated into a tool specific format before the same component can be specified on different tools. Therefore, a lot more time and resources are required in specifying different components.

On the other hand, mechanisms (e.g. software) for design entry and synthesis of components only facilitate the entry of non-natural specified parameters with a limited number of component modules. Typically, the component modules are available from a library where the designer manually selects one of them to use as a base component structure. As mentioned earlier, the component modules are user configurable (i.e., parameterizable). However, the parameter for configuring is generally limited to non-natural parameters such as the pipelining and/or the clock frequency. As such, compilation is required before natural parameters can be compared in confirming a component for use.

Parameters that are not natural or intuitive to a designer in defining the overall component are herein referred to as non-natural parameters. Non-natural parameters generally do not define the overall performance or scope of the component involved. Conversely, parameters that are natural or intuitive in terms of the thought process of a designer in defining the overall component are herein referred to as natural parameters. Natural parameters generally do define the overall performance or scope of the component involved. For example, natural parameters include data rate, latency, system clock, or usage area. In fact, non-natural parameters often require further processing before natural parameters become available. Furthermore, natural parameters, as opposed to non-natural parameters, are also used to compare with the system requirements. The system requirements being the minimum constraints (e.g., data rate, latency, area) imposed on the component by the system that is implemented on the programmable chip.

As shown, a designer 202 is provided with a set of natural parameters 201 (e.g., component defining parameters). In order to specifying time constraints on a component using a specific tool, natural parameters 201 are generally translated into non-natural parameters with a format specific to that tool. Designer 202 now has available non-natural parameters 204 for input into a parameterizable component 212, which is a basic component structure of the corresponding component 220 and is typically selected from a library. After the set of non-natural parameters 204 are inputted, parameterizable component 212 is manually put through a series of processes in generating a component that meets the system requirements. For example, parameterizable component 212 may first be inputted into a behavior simulator 214 for a high level simulation. Next, a synthesis tool 216 is provided for synthesis and logic optimization. Afterwards, parameterizable component 212 can be inputted through a technology mapping tool 218, placement and routing tool 220, and timing analysis tool 222. In general, behavior simulator 214, synthesis tool 216, technology mapping tool 218, placement and routing tool 220, and timing analysis tool 222 can be any number of conventional tools suitable for processing parameterizable component 212 until a component 224 with a set of non-natural parameters 225 is available. Non-natural parameters 225 are then translated from their tool specific format into associated natural parameters 226 for comparison to the original natural parameters 201. Natural parameters 226 include data rate 228, area 230, or latency 232.

Upon generating component 224 with associated natural parameters 226, the designer manually makes a comparison between natural parameters 226 and the system requirements (e.g., natural parameters 201). If natural parameters 226 meet the system requirements, generated component 224 will be chosen for implementation on the programmable chip. However, as is often the case, natural parameters 226 do not meet the system requirements. As such, the designer typically goes back to inputting another set of non-natural parameters 204 or selecting a different parameterizable component 212 from the library. Alternatively, the designer may perform additional processes with synthesis tool 216, technology mapping tool 218, or placement and routing tool 222. In any case, many of the processes shown in FIG. 2 are repeated until a generated component 224 with natural parameters finally meets the system requirements.

As one can imagine, the aforementioned system in FIG. 2 discloses a form of design entry and synthesis of components that is time consuming and tedious from the standpoint of the designer who is trying to select the right components for implementation on a programmable chip. Furthermore, due to the many manual steps involved, such as the comparing process, a non-optimal component can be selected. Consequently, it would be preferable to provide for a system that includes a form of design entry and synthesis of components that addresses these drawbacks.

Figure 3A:
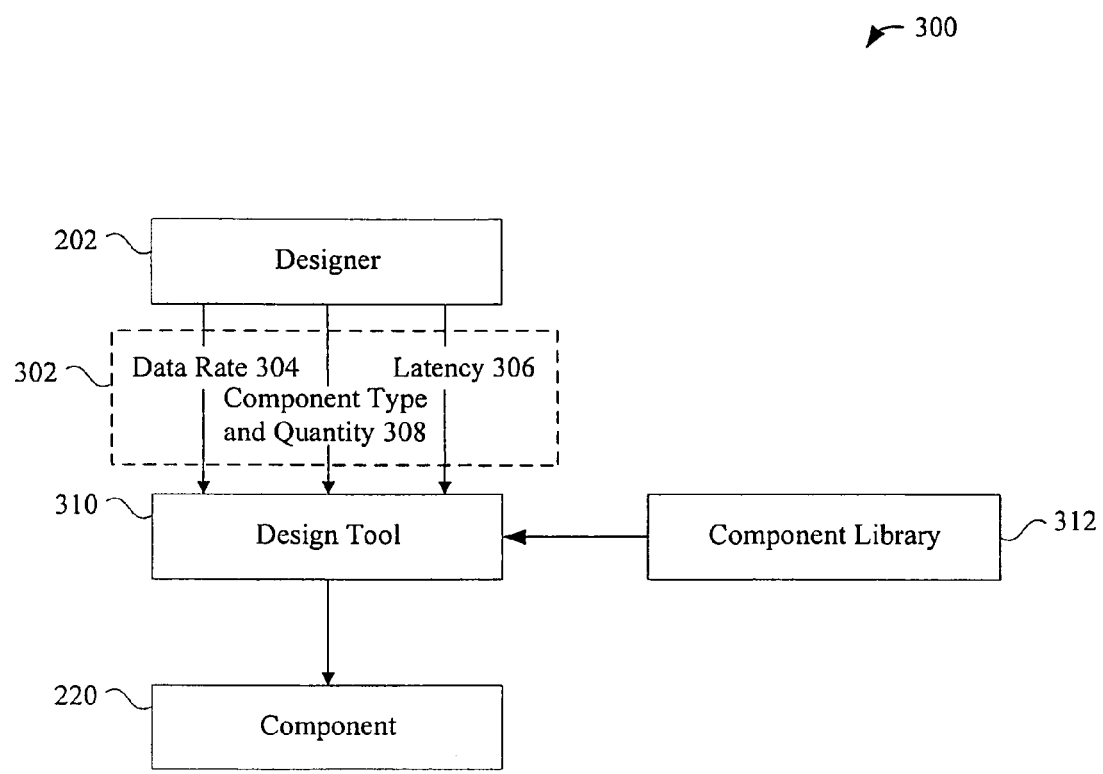
FIG. 3A is a diagrammatic representation showing one example of a system for inputting timing requirements.

FIG. 3A is a diagrammatic representation showing one example of a system 300 for inputting timing requirements that addresses these drawbacks. Here, designer 202 provides natural parameters 302 as inputs into a design tool 310. Similar to natural parameters 226, natural parameters 302 include data rate 304, latency 306, or component type and quantity 308. Design tool 310 is configured to apply natural parameters 302 to automatically select a component (i.e., candidate module) from a component library 312 and generate component 220. Design tool 310 contains numerous algorithms for intelligently generating component 220. Component library 312 contains numerous component(s) that have simulated information indicating corresponding natural parameters. Component library 312 will be discussed further below in FIG. 4.

Figure 3B:
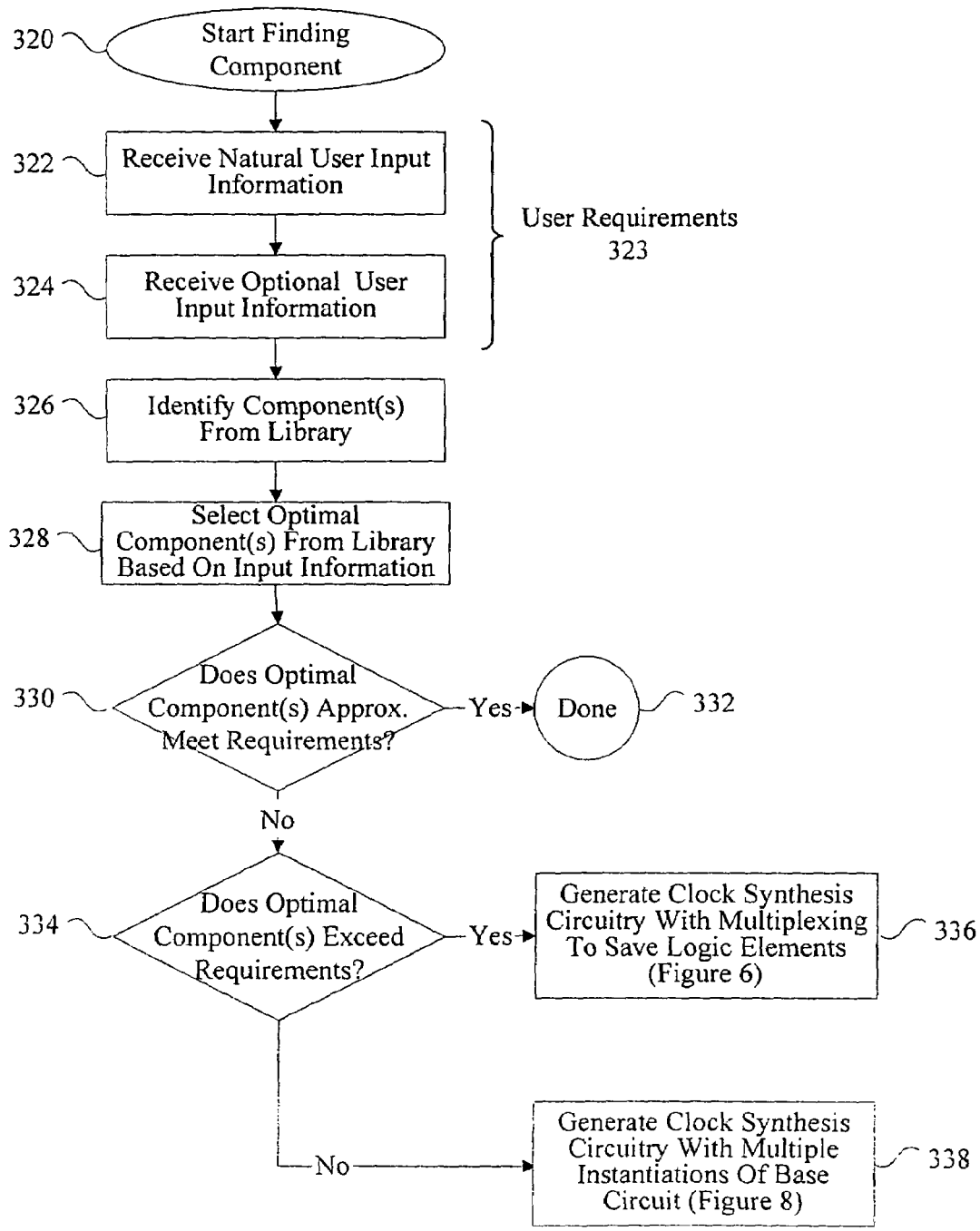
FIG. 3B is a flow process diagram showing the selection of a component that approximately meets user requirements.

FIG. 3B is a flow process diagram 315 showing the selection by design tool 310 of a component that approximately meets user/system requirements. It should be appreciated that any of the operations disclosed in FIG. 3B may be automated. Diagram 315 begins at operation 320 where the process of finding the component is initiated. The receiving of natural user input information is performed in operation 322. The natural user input information generally is restricted to only natural parameters 302. On the other hand, the receiving of optional user input information can be performed in operation 324. Optional user input information generally is restricted to only non-natural parameters 204. However, optional user input information may include specifying a set of available on chip or board clocks.

To further elaborate on the specification of a set of available on chip or board clocks, reference will now be made to the table in FIG. 4. Suppose that the user specifies available board clocks where no clock synthesizer is available, then the component(s) that can be selected by the design tool 310 will be limited by the board clocks available. For example, if board clocks of only 100 MHz and 200 MHz are available, then components 406(a-d) can be used at 100 MHz where component 406e can be used at 200 MHz. As such, their corresponding data rates for a 5 byte word multiplier will be 500 MB/s (i.e., 100 MHz×5 bytes) for components 406(a-d) and 1000 MB/s (i.e., 200 MHz×5 bytes) for component 406e. Also, each component will have a latency that equates to their corresponding (clock period)×(pipeline stages). On the other hand, if a clock synthesizer is available, then it can be used automatically to synthesize a higher clock frequency. The synthesized frequencies will depend on the available board clocks and the available kinds of synthesizer (e.g., PLL; DLL) for use.

After the receipt of natural user input information and optional user input information, design tool 310 performs the identifying of component(s) from a library (e.g., component library 312) in operation 326 of FIG. 3B. The selecting of an optimal component from the library is performed in operation 328. The selection is based on the user requirement 323 (e.g., user input information 322 or 324). For example, the selection may be based on the component type (e.g., FFT filter, multiplier, etc.). Alternatively, the selection may also be based on some predetermined or default set of factors/requirements (e.g., natural parameters 302, non-natural parameters 204) for prioritizing multiple identified component(s) in order to effectively select the optimal component. The factors are usually already present within design tool 310. Furthermore, the factors can be prioritized amongst themselves. In one embodiment, the factors are prioritized such that the date rate and latency requirements are initially met. In any case, the selection generally involves some intelligence (e.g., algorithm) for efficiently scanning through the available component(s) and selectively choosing the optimal component. For instance, selecting the optimal component by scanning the available component(s) for a component with the minimum area/power value, absolute area/power value, or with an area/power value within certain tolerances specified by the designer. In addition, the selection can be based on the area requirement first and then the power requirement second or on any other prioritized factors the designer chooses. As another example, selection may be based on a set of factors that effectively scans only a subset of the available component(s).

Process flow diagram 315 then continues to perform a couple of decision operations. First, decision operation 330 is performed to determine whether the selected optimal component(s) approximately meets user/system requirements. This generally includes comparing the natural parameters that correspond to the optimal component with the natural parameters inputted by the user. The comparison can be configured such that any approximate range for any differences will be allowed in approximately meeting the user/system requirements. For example, the range may either be a specific value that meets the user/system requirements or a number of values within a given tolerance, such as a tolerance of about 10 percent from the specific value. In another example, the range may allow for a tolerance of about two times the specific value in order to effectively use some of the techniques of the present invention, such as the multiplexing technique described below in operation 336. If the selected optimal component approximately meets the user/system requirements, then process flow diagram 315 ends at operation 332. At this point, the selected optimal component is available for implementation on the programmable chip.

If the selected optimal component does not approximately meet user/system requirements, then decision operation 334 is performed for determining whether the selected optimal components exceed the user/system requirements. Any criteria may be used for determining when the selected optimal components exceed the user/system requirements. However, this generally includes comparing the natural parameters that correspond to the optimal components with the natural parameters inputted by the user. In one embodiment, the selected optimal components exceed user/system requirements when the data rate of multiple selected optimal components combined is substantially faster than that required by the user in operation 322. If the selected optimal components exceed user/system requirements (e.g., by two or more times those specific values required), then the generation of clock synthesis circuitry with multiplexing may be performed in operation 336. Generally, the purpose of operation 336 is to save logic elements by replacing multiple selected components. Operation 336 will be described in further detail below in FIG. 6.

If on the other hand the selected optimal component does not exceed/approximately meet user/system requirements, then the generating of clock synthesis circuitry with multiple instantiations of the base circuit is performed in operation 338. Generally, the purpose of operation 338 is to increase the data rate at the expense of using more area and increasing output latency. Operation 338 will be described in further detail below in FIG. 8.

FIG. 4 is a diagrammatic representation of a portion of a library (e.g., 312) having component information. Preferably, the library includes components with synthesized/simulated information indicating associated natural parameters. The synthesized/simulated information is generally the result of a true timing simulation using accurate post place and route delays. Alternatively, the library may also include non-natural parameters or any other information for facilitating the selection of an optimal component. As shown, the portion includes several components 406 corresponding to a specific component type 308 (e.g., Altera's Cyclone device EP1C12F324C6, 40×40 multiplier w/5 byte words). It should be noted that other portions may include other component types (e.g., filters, counters, dividers, comparators, decoders, memory, logic devices, self-created macros, etc.). Each component (e.g., 406a, 406b, 406c, 406d, 406e) has corresponding natural (e.g., 404) and non-natural (e.g., 402) parameters with associated values. For example, natural parameters 404 include Lcell 404a (e.g., usage area), power usage (not shown), Data Rate 404b, and Latency 404c whereas non-natural parameters 402 include Pipeline 402a, Period 402b, Tco 402c, Fmax 402d. For clarification, Pipeline 402a refers to the number of pipeline stages, Period 402b refers to the clock period, Tco 402c refers to the clock-to-output times, Fmax 402d refers to clock rate in MHz, Lcell 404a refers to the logic elements count, Data Rate 404b refers to the maximum data rate in MB/sec, and Latency 404c refers to maximum output latency in nanoseconds.

The library will generally be configured to allow for easy scanning, identifying, and selecting of component(s) 406. Typically, component(s) 406 will be organized according to their component type. To gain a better understanding of how the library is used in relation to FIGS. 3A and 3B, the following examples are provided. For instance, suppose the received natural user input information 322 specifies a component type and quantity 308 of 1 multiplier with 5 byte words, latency of 40 ns, and data rate of 1100 MB/sec=220 MHz×5 bytes. Design tool 310 will then identify one or more components 406 that correspond to the specified component type from the library. Next, design tool 310 will select an optimal component (i.e., optimal candidate module) from the identified components 406 based on input information 322 and/or 324. According to FIG. 4, that optimal component would be component module 406e since it has a maximum data rate of 224 MHz×5 bytes=1120 MB/sec and latency of 38 ns, parameters that may approximately meet the user/system requirements as in operation 330. However, if the user specifies a maximum allowable latency of 35 ns, then components having a maximum data rate up to 163 MHz×5 bytes=815 MB/sec can be identified and possibly be selected as the optimal component.

Although a variety of components 406 may be available in a library, user/system requirements may not be optimally met. In one example, components may run at data rates that exceed user/system needs. In another example, components may run at data rates that do not meet user/system requirements. Consequently, the techniques of the present invention provide a design tool that automatically generates either multiplexer circuitry or multiple instantiations of the base circuit for allowing library components to approximately meet user/system requirements.

As an example, in reference to FIG. 4, suppose that two multipliers are specified (e.g., component type and quantity 308) where the data rate specified is only 100 MHz×5 bytes=500 MB/sec with no latency restrictions. Design tool 310 will then figure out that instead of implementing this using two components 406a from the library, it will be possible to use just one component 406e with clock synthesis circuitry and time-domain multiplexing (e.g., 336) in generating/synthesizing a revised optimal component. As a result, approximately 3000 logic elements can be saved and usage area be reduced.

Figure 5A:
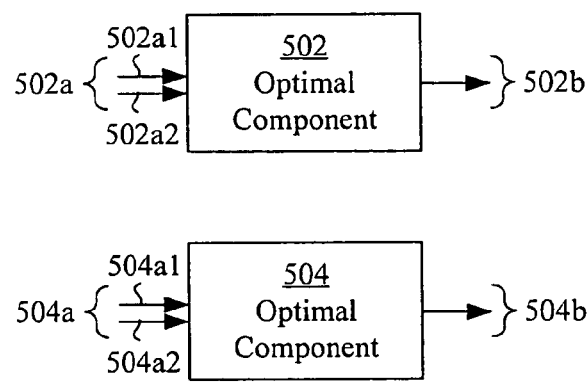
FIG. 5A is a diagrammatic representation showing selected optimal components that exceed user/system requirements.

To illustrate, FIG. 5A is a diagrammatic representation showing selected optimal components that exceed user/system requirements. A first selected optimal component 502 is shown with inputs 502a (e.g., 502a1 and 502a2) and outputs 502b. A second selected optimal component 504 is shown with inputs 504a (e.g., 504a1 and 504a2) and outputs 504b. Multiple selected optimal components may be provided. Generally, the number of selected optimal components is based on the user requirements 323 (e.g., component type and quantity 308).

Figure 5B:
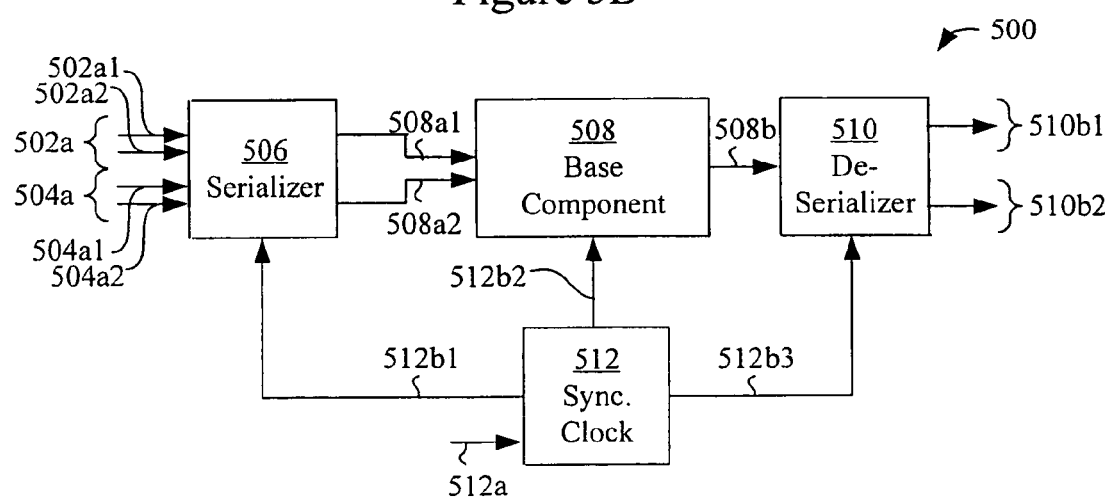
FIG. 5B is a diagrammatic representation showing a revised optimal component using multiplexing to handle multiple data streams.

Upon determining that the selected optimal component modules exceed user/system requirements in operation 334, design tool 310 will automatically generate clock synthesis circuitry and use multiplexing to save logic elements and reduce usage area. FIG. 5B is a diagrammatic representation showing a revised optimal component 500 using multiplexing to handle multiple data streams. In a preferred embodiment, multiplexing allows the reduction in usage area by replacing the selected optimal components with a circuit (e.g., revised optimal component 500) that possesses characteristics (e.g., natural parameters, non-natural parameters) that at least match those possessed by the selected optimal components. To accomplish this, respective inputs 502a and 504a are first input into revised optimal component 500 through a serializer 506. Any suitable serializer 506 may be used to effectively combine inputs 502a and 504a into corresponding output serial data streams 508a1 and 508a2. Serial data streams 508a1 and 508a2 are then input into a base component 508, which is selected from the library. In general, base component 508 will be a component that has certain properties (e.g., natural parameters, non-natural parameters) that at least meet those of the individual selected optimal components 502 and 504. For example, base component 508 and optimal components 502 and 504 are of the same component type.

Referring back to FIG. 5B, an output 508b is generated by base component 508 and input into a de-serializer 510. De-serializer 510 will separate the combined output data stream into individual output data streams. Afterwards, de-serializer 510 (or revised optimal component 500) will generate outputs 510b1 and 510b2 that are the corresponding results of inputs 502a and 504a having been processed by base component 508. In one embodiment, de-serializer 510 will generate outputs 510b1 and 510b2 that substantially reproduce the information contained in outputs 502b and 504b.

To facilitate the generation of outputs 510b1 and 510b2 in FIG. 5B, a synchronization clock 512 is often provided. Any suitable synchronization clock 512 may be used to generate outputs 510b1 and 510b2. For example, synchronization clock 512 may include either a phase-locked loop (PLL) or a delay-locked loop (DLL). In one embodiment, synchronization clock 512 receives a system clock input 512a and communicates (e.g., via signal lines 512b1, 512b2, 512b3) with serializer 506, base component 508, and deserializer 510.

Figure 6:
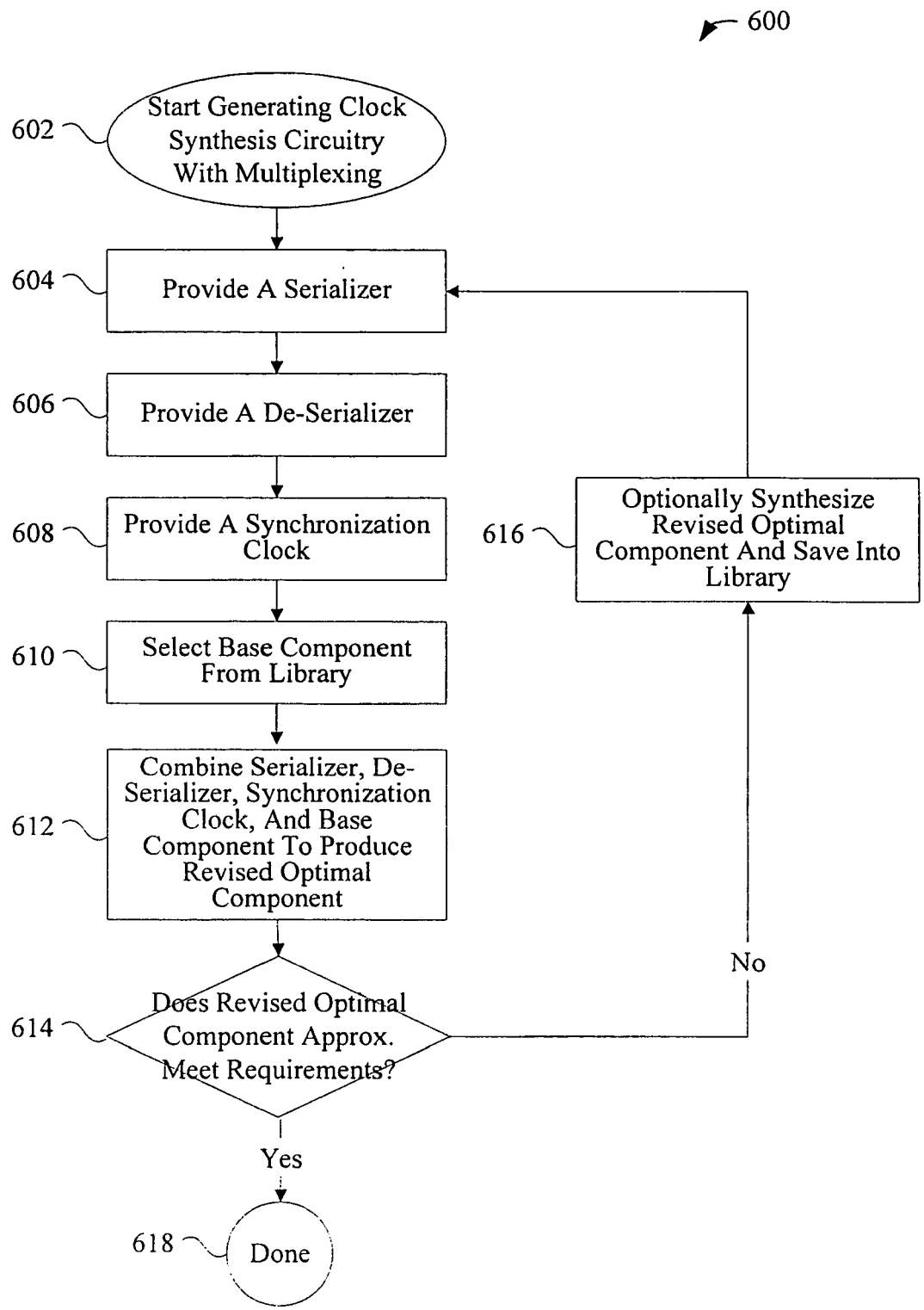
FIG. 6 is a flow process diagram 600 showing the selection of a component where the selected optimal components exceed user/system requirements.

FIG. 6 is a flow process diagram 600 showing the selection of a component where the selected optimal components exceed user/system requirements. Flow process diagram 600 generally illustrates operation 336 in FIG. 3B. Beginning at operation 602, the generating of clock synthesis circuitry with multiplexing is initiated (e.g., revised optimal component 500). Accordingly, a serializer (e.g., 506) is provided in operation 604. As indicated, any suitable serializer may be used to generate serial data streams (e.g., 508a1, 508a2) from any number of inputs. Typically, the inputs are grouped into sets (e.g., 502a, 504a) where corresponding serial data streams containing information from each set is output by the serializer. For example, serial data stream 508a1 contains the information in both inputs 502a1 and 504a1. Likewise, serial data stream 508a2 contains information in both inputs 502a2 and 504a2. To counter the effects produced by the serializer as provided in operation 604, a de-serializer (e.g., 510) is provided in operation 606.

In order to facilitate the generation of substantially accurate outputs (e.g., 510b1, 510b2) that correspond to the inputs (e.g., 502a, 502b) of revised optimal component 500, a synchronization clock (e.g., 512) is provided in operation 608. Any suitable synchronization clock mechanism may be used to synchronize the signals within the operations performed by revised optimal component 500. In one embodiment, synchronization clock communicatively connects to the serializer, de-serializer, and base component. In another embodiment, synchronization clock facilitates the generation of outputs of revised optimal component 500 that are effectively the same as those (e.g., 502b, 504b) of the individual selected optimal components (e.g., 502, 504).

Next, the selecting of a base component (e.g., 508) from a library is performed in operation 610. In general, the selected base component will possess characteristics (e.g., natural parameters, non-natural parameters) that at least match those of the selected optimal components (e.g., 502, 504). In a preferred embodiment, the base component will further possess characteristics (e.g., data rate) that at least match those possessed by the individual selected optimal components combined. In addition, the base component will be of the same component type as the selected optimal components. As such, a base component will often possess the same functionality as the selected optimal components. For instance, the selected base component will generally provide the same functionality at a lower data width (in order to save area), but at a much higher clock frequency than would have been possible for the selected optimal components. As mentioned earlier, the selected optimal components may be made available in a library. Alternatively, the selected optimal components may be made available when synthesized from RTL.

After the serializer, de-serializer, synchronization clock, and base component are either provided or selected, operation 612 is performed to combine them in generating/synthesizing a revised optimal component. Any automatic combination or arrangement, using multiplexing to allow a single selected component to handle multiple data streams is referred to herein as a revised optimal component. For example, as shown in FIG. 5B, serializer 506 and de-serializer 510 straddle base component 508 where de-serializer 510 is positioned downstream from serializer 506. In addition, synchronization clock 512 is positioned alongside serializer 506, base component 508, and de-serializer 510 while being coupled with each of them.

Finally, a decision operation 614 is performed to determine whether the revised optimal component approximately meets the user/system requirements. If it does, then flow process diagram 600 ends at operation 618. Otherwise, the optional step of operation 616 may be performed where the revised optimal component is synthesized and saved into the library. Whether the optional step of operation 616 is performed or not, a loop through operations 604, 606, 608, 610, 612, 614, and optionally 616 is performed until a revised optimal component approximately meets the user/system requirements.

In some embodiments, revised optimal component may be further implemented with dual-port RAM modules. This may be helpful in cases where multiplexing and de-multiplexing at rates of more than two times (e.g., 7 times) or at fractional rates are desired. Additionally, revised optimal component may be implemented with the use of a FIFO to switch to an intermediate clock domain that could be at a frequency not simply related (e.g., not an integer multiple or fraction of either the input or the output data rate). For example, a system with data width of N bytes at x MB/sec data rate can have the data processed in the intermediate stages at M bytes wide and y MB/sec as long as the equation $N*x=M*y$ is satisfied. In general, the user provides N and x. Design tool 310 then selects a component from the library with a particular M and y that satisfies the equation with the minimum usage area (e.g., footprint). Revised optimal component is then synthesized with rate matching FIFO to achieve the x to y rate conversion. Furthermore, revised optimal component can be synthesized with a similar rate converting circuit for y to x rate conversion in order to get back the original data rate and data width.

On the other hand, in reference to FIGS. 3B and 4, if one multiplier is specified and the selected optimal component does not meet the data rate specified by the user, design tool 310 would then use clock synthesis circuitry with multiple instantiations of a base circuit to generate a revised optimal component. Any automatic combination or arrangement of multiple instantiations of a selected component to meet user/system requirements is also referred to herein as a revised optimal component. The base circuit may either be the selected optimal component or any of the identified components 406.

Figure 7A:
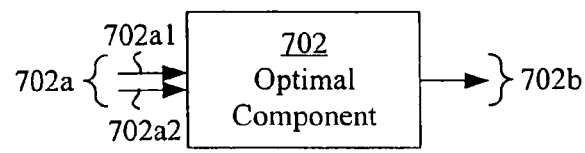
FIG. 7A is a diagrammatic representation showing a selected optimal component for use in multiple instantiations.

To illustrate, FIG. 7A is a diagrammatic representation showing a selected optimal component for use with multiple instantiations of a selected component. A selected optimal component 702 is shown with inputs 702a (e.g., 702a1 and 702a2) and outputs 702b. Here, selected optimal component 702 does not approximately meet the user/system requirements.

Figure 7B:
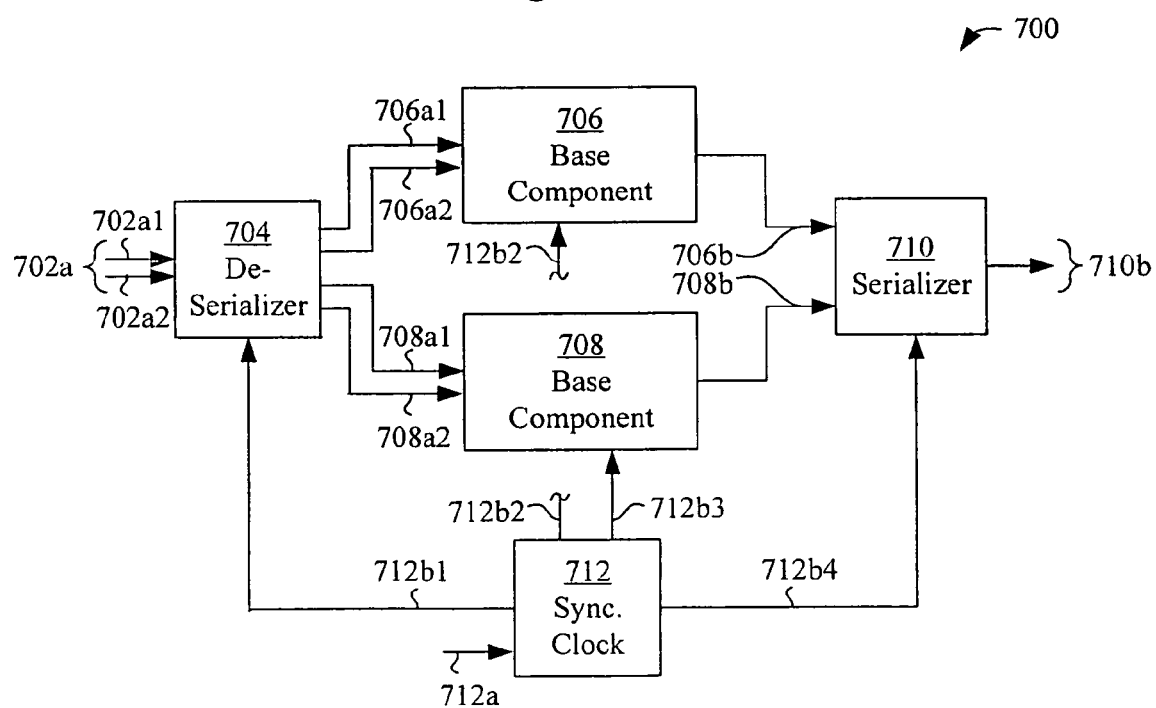
FIG. 7B is a diagrammatic representation showing the use of multiple instantiations of a base circuit.

Upon determining that selected optimal component 702 does not exceed/approximately meet user/system requirements in operation 334, design tool 310 automatically generates clock synthesis circuitry with multiple instantiations of a base circuit to provide a revised optimal component. FIG. 7B is a diagrammatic representation showing the use of multiple instantiations of a base circuit (e.g., selected optimal component 702). Using multiple instantiations of a base circuit may satisfy user/system requirements. However, having multiple instantiations results in the expense of increasing usage area (e.g., area occupied by the logic elements implementing revised optimal component 700) To use multiple instantiations, inputs 702a are first fed into revised optimal component 700 through a de-serializer 704. Any suitable de-serializer 704 may be used to effectively separate inputs 702a (e.g., 702a1, 702a2) into corresponding output de-serialized data streams 706a (e.g., 706a1, 706a2) and 708a (e.g., 708a1, 708a2). De-serialized data streams 706a and 708a are then input into corresponding base components 706 and 708, which are selected from the library. Typically, base components 706 and 708 will be a component that has properties (e.g., natural parameters, non-natural parameters) that are similar to those of selected optimal component 702. For example, base components 706, 708, and selected optimal component 702 are of the same component type. In a preferred embodiment, base components 706 and 708 are multiple instantiations of selected optimal component 702. That is, base components 706, 708, and selected optimal component 702 are substantially the same. Further, it should be appreciated that there could be any number of base components selected for implementation.

Referring back to FIG. 7B, corresponding outputs 706b and 708b are generated by base components 706 and 708 and input into a serializer 710. Serializer 710 combines individual data streams into a single output data stream. Serializer 710 (or revised optimal component 700) will generate output 710*b* that corresponds to the results of inputs 702*a* having been processed by base components 706 and 708. In one embodiment, serializer 710 will generate output 710*b* that substantially reproduces the information contained in output 702*b*.

To facilitate the generation of output 710*b* in FIG. 7B, a synchronization clock 712 is often provided. Any suitable synchronization clock 712 may be used to generate output 710*b*. For example, synchronization clock 712 may include either a phase-locked loop (PLL) or a delay-locked loop (DLL). In one embodiment, synchronization clock 712 receives a system clock input 712*a* and communicates (e.g., via signal lines 712*b*1, 712*b*2, 712*b*3, 712*b*4) with de-serializer 704, base components 706 and 708, and serializer 710.

Figure 8:
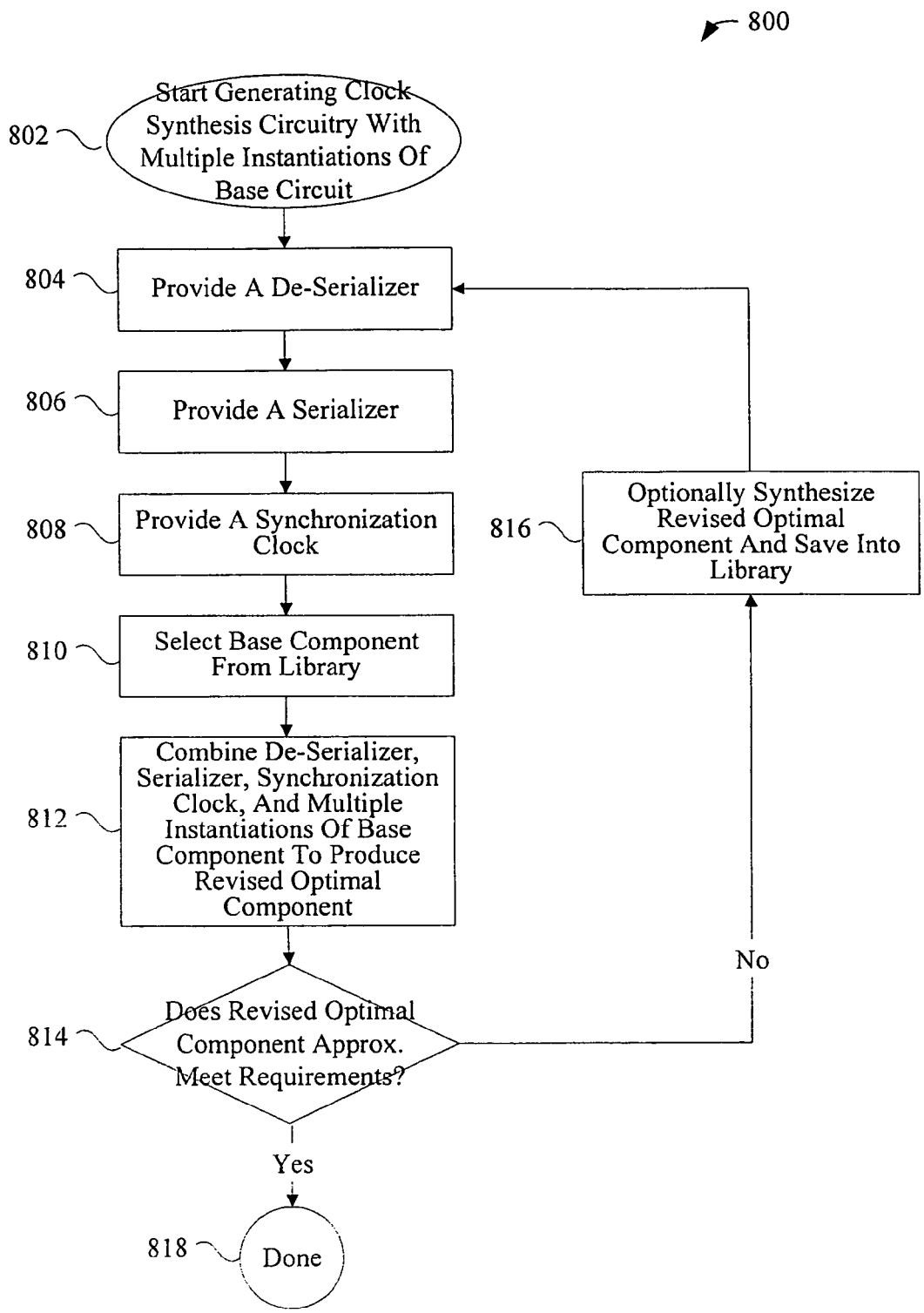
FIG. 8 is a flow process diagram showing the selection of a component where the selected optimal component does not exceed user/system requirements.

FIG. 8 is a flow process diagram 800 showing the selection of a component where the selected optimal component(s) does not exceed user/system requirements. Flow process diagram 800 generally illustrates operation 338 in FIG. 3B. Beginning at operation 802, generation of clock synthesis circuitry with multiple instantiations of a base circuit is initiated (e.g., revised optimal component 700). Accordingly, a de-serializer (e.g., 704) is provided in operation 804. As indicated, any suitable de-serializer may be used to generate corresponding de-serialized data streams (e.g., 706*a*, 708*a*) from any number of inputs 702*a*. Typically, the de-serialized data streams are grouped into sets (e.g., 706*a*, 708*a*) where each set includes a portion of the information contained in inputs 702*a*. For example, de-serialized data stream 706*a*1 includes a de-serialized portion of information contained in input 702*a*1. In addition, de-serialized data stream 706*a*2 includes a de-serialized portion of information contained in input 702*a*2. On the other hand, de-serialized data stream 708*a*1 includes another de-serialized portion of information contained in input 702*a*1. Similarly, de-serialized data stream 708*a*2 includes another de-serialized portion of information contained in input 702*a*2. Generally, each set of de-serialized data stream (e.g., 706*a*, 708*a*) contains a different de-serialized portion of information contained in the inputs (e.g., 702*a*). Collectively, however, the sets of de-serialized data streams include all the information contained in the inputs. To counter the effects produced by the de-serializer as provided in operation 804, a serializer (e.g., 710) is provided in operation 806. Generally, the serializer reverses the de-serialization in a data stream (e.g., 706*a*, 708*a*) as generated by a de-serializer (e.g., 704).

In order to facilitate the generation of a substantially accurate output (e.g., 710*b*) that corresponds to the inputs (e.g., 702*a*) of revised optimal component 700, however, a synchronization clock (e.g., 712) is provided in operation 808. Any suitable synchronization clock mechanism may be used to synchronize the signals within the operations performed by revised optimal component 700. In one embodiment, synchronization clock communicatively connects to the de-serializer, serializer, and base components. In another embodiment, synchronization clock facilitates the generation of output 710*b* of revised optimal component 700 that is effectively the same as that (e.g., 702*b*) of selected optimal component 702.

Next, the selecting of base components (e.g., 706, 708) from a library is performed in operation 810. In general, the selected base components will possess characteristics (e.g., natural parameters, non-natural parameters) that at least matches those possessed by the selected optimal component (e.g., 702). In addition, the base components will typically be of the same component type as the selected optimal component. As such, the base components will often possess the same functionality as the selected optimal component. In a preferred embodiment, however, base components 706 and 708 are the same as selected optimal component 702. For instance, the base component that is selected will generally be of the same data width and running at a clock frequency that does not meet the necessary data rate. Therefore, multiple instantiations of the base component is used to increase the effective data rate to the required one at the expense of using more area.

After the de-serializer, serializer, synchronization clock, and base components are either provided or selected, operation 812 is performed to combine them together in producing a revised optimal component. Any combination, as well as arrangement, may be used provided that an effective multiple instantiation of a base circuit (e.g., selected optimal component 702) can be realized to approximately meet user/system requirements. For example, as shown in FIG. 7B, de-serializer 704 and serializer 710 straddle base components 706 and 708 where serializer 710 is positioned downstream from de-serializer 704. In addition, synchronization clock 712 is positioned alongside de-serializer 704, base components 706, 708, and serializer 710 while being coupled with each of them.

Finally, a decision operation 814 is performed to determine whether the revised optimal component approximately meets the user/system requirements. If it does, then flow process diagram 800 ends at operation 818. Otherwise, the optional operation 816 may be performed where the revised optimal component is synthesized and saved into the library for future availability. Whether the optional step of operation 816 is performed or not, a loop through operations 804, 806, 808, 810, 812, 814, and optionally 816 is performed until a revised optimal component approximately meets the user/system requirements.

Figure 9:
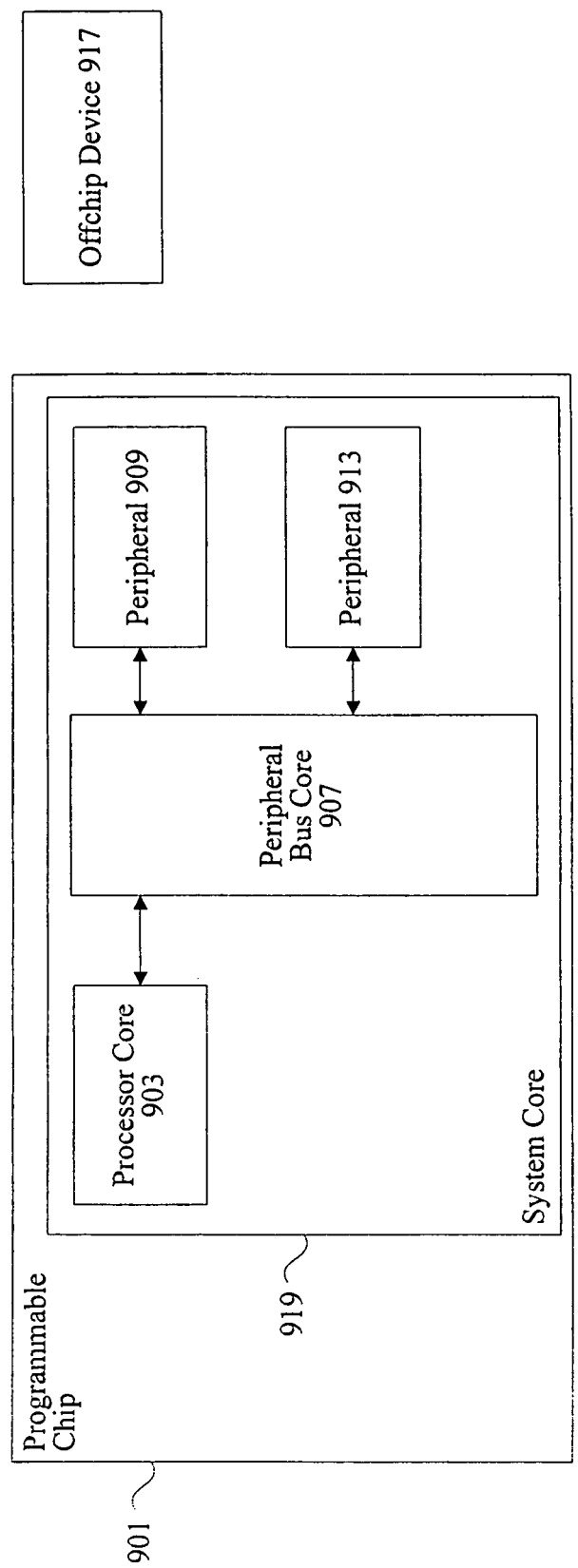
FIG. 9 is a diagrammatic representation showing a programmable chip that can be implemented using the techniques of the present invention.

FIG. 9 is a diagrammatic representation showing a programmable chip that can be implemented using the techniques of the present invention. Any device including programmable logic is referred to herein as a programmable chip. A programmable chip 901 contains logic for system core 919 along with logic elements (LEs). In one example, system core 919 contains a dynamically generated peripheral bus 907. The dynamically generated peripheral bus 907 allows interconnections between processor core 903 and peripherals 909 and 913. System core 919 allows interconnections between a peripheral 913 and off-chip devices 917. System core 919 defines various interfaces to allow processor core 903, peripheral bus 907, peripheral 909, and peripheral 913 to connect to off-chip devices as well as other logic on the programmable chip 901. A variety of software tools can be used to implement programmable chip 901. It should be noted that the techniques can also be applied to other chips such as ASICs.

Figure 10:
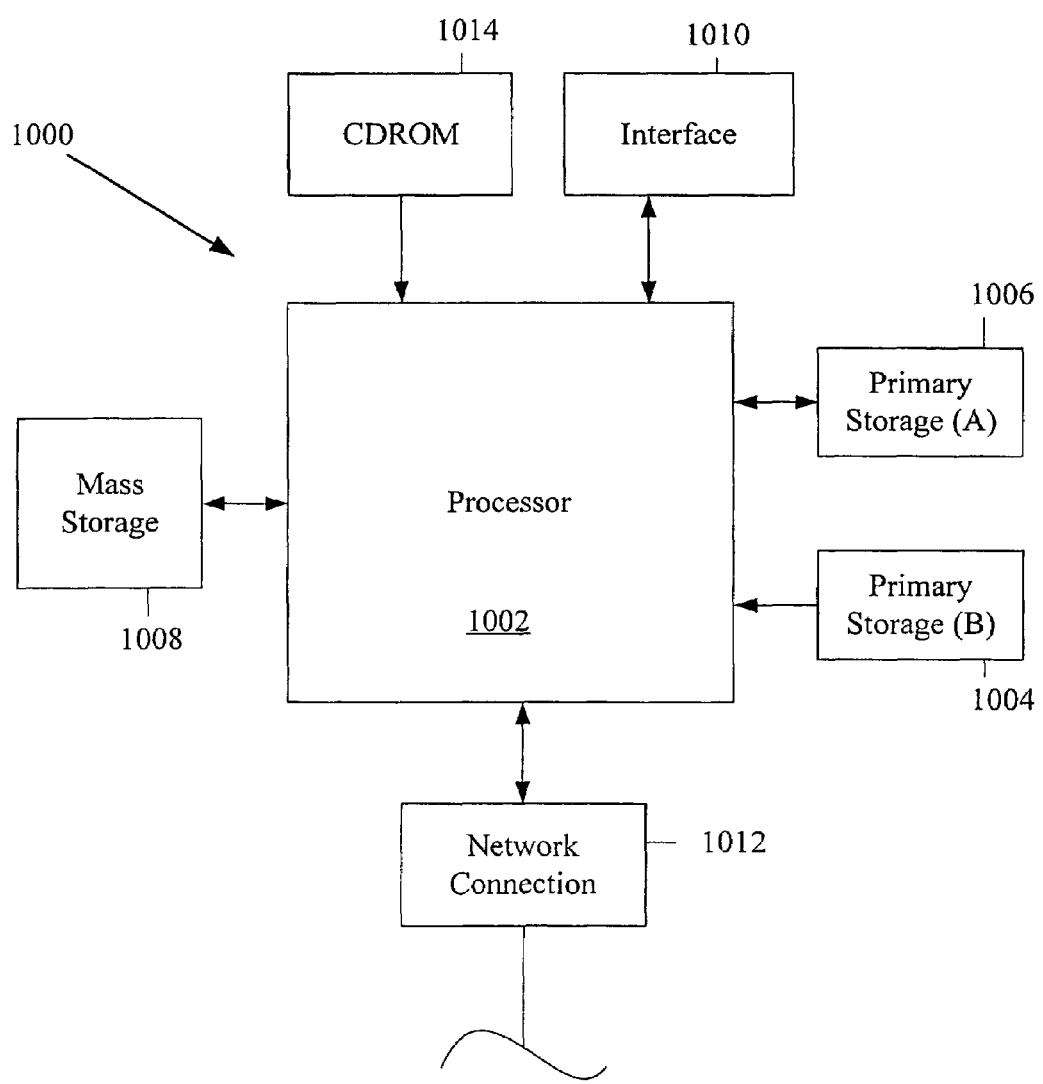
FIG. 10 is a diagrammatic representation showing a computer system that can implement programmable chips using components of the present invention.

FIG. 10 is a diagrammatic representation showing a computer system that can implement programmable chips using components of the present invention. The computer system 1000 includes any number of processors 1002 (also referred to as central processing units, or CPUs) that are coupled to storage devices including primary storage 1006 (typically a random access memory, or "RAM"), primary storage 1004 (typically a read only memory, or "ROM"). The processors 1002 can be configured to receive selections and parameters from a user to dynamically generate a logic description. The primary storage 1006 can be used to hold a library or database of components, as well as information on various components. As is well known in the art, primary storage 1004 acts to transfer data and instructions uni-directionally to the CPU and primary storage 1006 is used typically to transfer data and instructions in a bi-directional manner. Both of these primary storage devices may include any suitable type of the computer-readable media described above. Primary storage devices can also be used to hold parameter information for the components being customized.

A mass storage device 1008 is also coupled bi-directionally to CPU 1002 and provides additional data storage capacity and may include any of the computer-readable media described above. The mass storage device 1008 may be used to store programs, data and the like and is typically a secondary storage medium such as a hard disk that is slower than primary storage. It will be appreciated that the information retained within the mass storage device 1008, may, in appropriate cases, be incorporated in standard fashion as part of primary storage 1006 as virtual memory. A specific mass storage device such as a CD-ROM 1014 may also pass data uni-directionally to the CPU.

CPU 1002 is also coupled to an interface 1010 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Video monitors can be used to display component wizards and sub-wizards of design tool 310 to a user. Finally, CPU 1002 optionally may be coupled to a computer or telecommunications network using a network connection as shown generally at 1012. With such a network connection, it is contemplated that the CPU might receive information from the network, or might output information to the network in the course of performing the above-described method steps. The above-described devices and materials will be familiar to those of skill in the computer hardware and software arts.

The hardware elements described above may be configured for performing the operations of this invention. For example, instructions for running a generator program, input stage (e.g., a wizard), design tool, and/or compiler may be stored on mass storage device 1008 or 1014 and executed on CPU 1008 in conjunction with primary memory 1006.

Although many of the components and processes are described above in the singular for convenience, it will be appreciated by one of skill in the art that multiple components and repeated processes can also be used to practice the techniques of the present invention. Furthermore, some process steps may be omitted or arranged differently in sequence as will be apparent to one skilled in the art.

Many advantages of the present invention are evident. For example, the techniques for efficient and practical design entry of components are realized by the entering of natural parameters (e.g., data rate or output latency). As such, design timing constraints (e.g., clock frequency) included in non-natural parameters do not have to be translated into a tool specific format when specifying the same components among different tools. In addition, the design tool of the present invention allows for higher chip utilization efficiency. That is, by virtue of an automated design tool of the present invention, many more candidate modules (e.g., components) will be considered than what a human designer can do. Therefore, a lower usage area may be effectively sought. Ultimately, the techniques of the present invention allow synthesis of much more efficient circuits meeting the user timing requirements while occupying the least area.

While the invention has been particularly shown and described with reference to specific embodiments thereof, it will be understood by those skilled in the art that changes in the form and details of the disclosed embodiments may be made without departing from the spirit or scope of the invention. For example, the embodiments described above may be implemented using firmware, software, or hardware. Moreover, embodiments of the present invention may be employed with a variety of different file formats, languages, and communication protocols and should not be restricted to the ones mentioned above. Therefore, the scope of the invention should be determined with reference to the appended claims.

What is claimed is:

1. A method for implementing an electronic design, the method comprising:
   receiving input information identifying a desired module and one or more desired natural parameters associated with the desired module;
   identifying a plurality of candidate modules, each of the plurality of candidate modules is associated with simulated natural parameters;
   selecting an optimal candidate module from the pool of candidate modules for implementing the electronic design, the optimal candidate module selected using the desired natural parameters; and,
   generating clock synthesis circuitry if the optimal candidate module does not approximately meet the one or more natural parameters.

2. The method of claim 1, wherein the natural parameter is selected from the group consisting of input data rate, output latency, area, power, component type, quantity, and system clock associated with the desired module.

3. The method of claim 2, wherein simulation information also indicates output latencies.

4. The method of claim 3, wherein receiving the desired data rate and the desired output latency allows selection of the optimal candidate module without having to receive information on clock frequency.

5. The method of claim 1, further comprising generating a revised optimal module by using time-domain multiplexing if the optimal candidate module runs at a data rate substantially faster than the desired input data rate.

6. The method of claim 5, further comprising generating a clock synthesis circuit to allow multiplexing.

7. The method of claim 6, wherein the clock synthesis circuit comprises a phase lock loop.

8. The method of claim 6, wherein the clock synthesis circuit comprises a delay lock loop.

9. The method of claim 1, further comprising generating a revised optimal module by using multiple instantiations of the optimal candidate module if the optimal candidate module runs at a data rate substantially slower than the desired input data rate.

10. The method of claim 1, wherein the plurality of candidate modules are associated with chip area usage requirements and power requirements.

11. The method of claim 10, wherein chip area usage requirements and power requirements are used as factors in selecting the optimal candidate module.

12. The method of claim 1, further comprising performing timing simulation using the optimal candidate module.

13. The method of claim 1, further comprising receiving system clock information.

14. The method of claim 1, further comprising:
   implementing the electronic design on an electronic device, the electronic device being selected from the group consisting of an ASIC and a programmable device.

15. A computer program product comprising a machine readable medium on which is provided program instructions for implementing an electronic design, the program instructions comprising:

instructions for receiving input information identifying a desired module and one or more desired natural parameters associated with the desired module;

instructions for identifying a plurality of candidate modules, each of the plurality of candidate modules is associated with simulated natural parameters;

instructions for selecting an optimal candidate module from the pool of candidate modules for implementing the electronic design, the optimal candidate module selected using the desired natural parameters; and, instructions for generating clock synthesis circuitry if the optimal candidate module does not approximately meet the one or more natural parameters.

16. The computer program product of claim 15, wherein the natural parameter is selected from the group consisting of input data rate, output latency, area, power, component type, quantity, and system clock associated with the desired module.

17. The computer program product of claim 16, wherein simulation information also indicates output latencies.

18. The computer program product of claim 17, wherein instructions for receiving the desired data rate and the desired output latency allows selection of the optimal candidate module without having to receive information on clock frequency.

19. The computer program product of claim 15, further comprising instructions for generating a revised optimal module by using time-domain multiplexing if the optimal candidate module runs at a data rate substantially faster than the desired input data rate.

20. The computer program product of claim 19, further comprising instructions for generating a clock synthesis circuit to allow multiplexing.

21. The computer program product of claim 20, wherein the clock synthesis circuit comprises a phase lock loop.

22. The computer program product of claim 20, wherein the clock synthesis circuit comprises a delay lock loop.

23. The computer program product of claim 15, further comprising instructions for generating a revised optimal module by using multiple instantiations of the optimal candidate module if the optimal candidate module runs at a data rate substantially slower than the desired input data rate.

24. The computer program product of claim 15, wherein the plurality of candidate modules are associated with chip area usage requirements and power requirements.

25. The computer program product of claim 24, wherein chip area usage requirements and power requirements are used as factors in selecting the optimal candidate module.

26. The computer program product of claim 15, further comprising instructions for performing timing simulation using the optimal candidate module.

27. The computer program product of claim 15, further comprising instructions for receiving system clock information.

28. An apparatus for implementing an electronic design, the apparatus comprising:
a design tool configured to
receive input information identifying a desired module and one or more desired natural parameters associated with the desired module;
identify a plurality of candidate modules, each of the plurality of candidate modules is associated with simulated natural parameters;
select an optimal candidate module from the pool of candidate modules for implementing the electronic design, the optimal candidate module selected using the desired natural parameters; and,
generate clock synthesis circuitry if the optimal candidate module does not approximately meet the one or more natural parameters.

29. The apparatus of claim 28, wherein the natural parameter is selected from the group consisting of input data rate, output latency, area, power, component type, quantity, and system clock associated with the desired module.

30. The apparatus of claim 29, wherein the optimal candidate module is selected using the desired input data rate and the desired output latency.

31. The apparatus of claim 29, wherein receiving the desired data rate and the desired output latency allows selection of the optimal candidate module without having to receive information on clock frequency.

32. The apparatus of claim 28, wherein the design tool is configured to generate a revised optimal module using time-domain multiplexing if the optimal candidate module runs at a data rate substantially faster than the desired input data rate.

33. The apparatus of claim 32, further comprising having the design tool configured to generate a clock synthesis circuit to allow multiplexing.

34. The apparatus of claim 28, further wherein the design tool is configured to generate a revised optimal module using multiple instantiations of the optimal candidate module if the optimal candidate module runs at a data rate substantially slower than the desired input data rate.

35. The apparatus of claim 28, wherein the plurality of candidate modules are associated with chip area usage requirements and power requirements that are used as factors in selecting the optimal candidate module.

36. The apparatus of claim 28, further comprising having the design tool configured to perform timing simulation using the optimal candidate module.

37. The apparatus of claim 28, further comprising having the design tool configured to receive system clock information.

38. The apparatus of claim 28, wherein the electronic design is for implementation on an electronic device, the electronic device being selected from the group consisting of an ASIC and a programmable device.

* * * * *